United States Patent [19]

Desjardins

[11] Patent Number: 4,973,890
[45] Date of Patent: Nov. 27, 1990

[54] CASCODE MIRROR VIDEO AMPLIFIER

[75] Inventor: Francois Desjardins, Mary Hill, Canada

[73] Assignee: Electrohome Limited, Kitchener, Canada

[21] Appl. No.: 521,440

[22] Filed: May 10, 1990

[51] Int. Cl.[5] .............................................. H01J 29/52
[52] U.S. Cl. ..................................... 315/383; 330/296
[58] Field of Search ....................... 315/383; 358/168; 330/296

[56] References Cited

U.S. PATENT DOCUMENTS 4,641,063 2/1987 Smushkovich ...................... 315/383
4,651,064 3/1987 Parker et al. ....................... 315/383

*Primary Examiner*—Theodore M. Blum
*Attorney, Agent, or Firm*—Sim & McBurney

[57] ABSTRACT

A cascode mirror video amplifier for generating equal amplitude and opposite phase signals for driving a cathode and control grid of a cathode ray tube. The video amplifier comprises a pair of common base amplifiers connected via equal valued resistances to a pair of opposite polarity power sources. A common emitter amplifier is connected intermediate the pair of cascaded common base amplifiers and functions as a voltage control current source for receiving an input signal and in response generating a common current signal within each of the pair of common base amplifiers such that equal amplitude and opposite phase voltage signals are generated across the respective resistances. A pair of emitter follower stages apply the voltage across the resistance pair to the electron source cathode and control grid respectively while isolating the load capacitance of the cathode ray tube from each of the common base amplifiers.

19 Claims, 2 Drawing Sheets

CASCODE MIRROR VIDEO AMPLIFIER

FIELD OF THE INVENTION

This invention relates in general to video display systems, and more particularly to a cascode mirror video amplifier for driving the electron source cathode and control grid of a cathode ray tube.

BACKGROUND OF THE INVENTION

The electron gun of a cathode ray tube (CRT) consists of two sections—the triode and the lens. The lens focuses the emitted electrons using three typically cylindrical elements aligned end to end on the gun axis with the triode. The triode forms the electron emitting section of the gun and comprises an electron source cathode, control grid and accelerator grid.

In operation, the cathode is heated to boil off free electrons. The control grid of the gun alternately enables and disables the electron flow as a function of negative potential. Various combinations of bias control are effective for operating the triode. For example, the electron flow from the cathode can be controlled by means of the video signal while holding the control grid at a constant cut-off potential relative to the accelerator grid. Alternatively, the video signal can be applied to the control grid while the cathode potential is maintained constant, or the video signal can be applied to the control grid and cathode with opposite phase.

Optimum performance of projection CRT guns has been found to occur with the cut-off (i.e. no electron flow) potential between the cathode and control grid to a potential maintained at a predetermined value (e.g. typically 150 volts). This is done by biasing the accelerator grid to a potential (e.g. 400 volts to 1000 volts) at which electron flow is barely stopped when the cathode and control grid potential is set at the aforementioned cut-off potential.

Thus, when the potential between the control grid and cathode is decreased from the cut-off value, electrons are caused to flow from the cathode to the phosphor coating on the viewing surface of the CRT, resulting in generation of a visual image. The maximum allowable current flow occurs when the potential between the control grid and cathode is zero volts.

According to the prior art, wide dynamic range video amplifiers have been utilized to control the potential between the cathode and control grid of a CRT electron gun. One prior art approach utilizes cascode video amplifiers incorporating high voltage transistors. However, it has been found that such high voltage video transistors are characterized by limited frequency response and therefore incapable of providing the wide dynamic range and high bandwidth required for high resolution projections systems.

According to another prior art approach, a pair of smaller cascode amplifiers have been utilized for driving the cathode and control grid with opposite phase signals. However, this approach results in phase problems due to the delay variations between response times of the two cascode amplifiers.

SUMMARY OF THE INVENTION

According to the present invention, a cascode mirror high bandwidth video amplifier is provided for driving the cathode and control grid of a CRT electron gun with equal amplitude and opposite phase voltage signals, thereby overcoming the delay variations inherent in the latter mentioned prior art approach. More particularly, a driver transistor is utilized in the form of a voltage controlled current source intermediate a pair of cascode amplifiers such that the current flowing through the load resistors of the amplifiers are common to both, thereby eliminating delay variations between the opposite phase signals.

In accordance with an aspect of the present invention, there is provided a circuit for generating equal amplitude and opposite phase signals, comprising a pair of cascaded amplifiers connected via respective equal valued resistances to a pair of opposite polarity power sources, and a voltage controlled current source common to each said pair of amplifiers for receiving an input signal and in response generating a common current signal within each said pair of amplifiers such that equal amplitude and opposite phase voltage signals are generated across said respective resistances.

In accordance with another aspect of the present invention there is provided a video amplifier for controlling an electron source cathode and a control grid of a cathode ray tube, comprising:
 (a) a first cascode stage connected to a first DC power source through a first pull-up resistor;
 (b) a second cascode stage connected to a second DC power source through a second pull-up resistor;
 (c) a voltage controlled current source common to each said first and second stages for receiving an input signal and in response generating a common current signal within each said first and second stages such that respective first and second equal amplitude and opposite phase voltage signals are generated across said first and second pull-up resistors, respectively;
 (d) a first emitter-follower stage for receiving and applying said first voltage signal to said electron source cathode while isolating load capacitance of said cathode ray tube from said first cascode stage; and
 (e) a second emitter-follower stage for receiving and applying said second voltage signal to said control grid while isolating load capacitance of said cathode ray tube from said second cascode stage.

BRIEF DESCRIPTION OF THE DRAWINGS

A detailed description of the preferred embodiment is provided herein below with reference to the following drawings, in which.

DETAILED DESCRIPTION OF THE INVENTION

Figure 1:
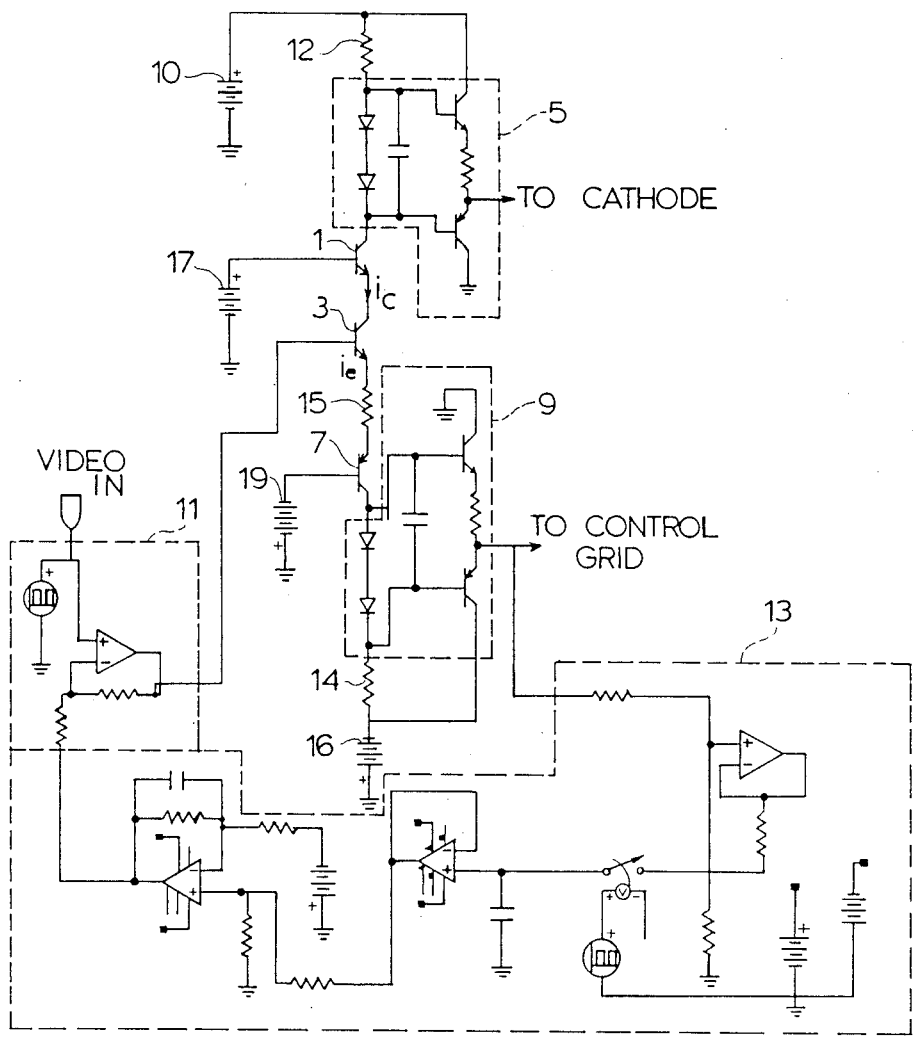
FIG. 1 is a schematic diagram of the video amplifier circuit in accordance with the preferred embodiment.

FIG. 1 is a schematic diagram of a cascode mirror high bandwidth video amplifier in accordance with the preferred embodiment. The circuit is so named because it comprises two amplifiers, each being the mirror image of the other. The first such amplifier includes a cascode stage comprising transistors 1 and 3 and an output stage 5. Likewise, the mirror image amplifier includes a cascode stage comprising transistor 3 (transistor 3 being common to the cascode stages of both amplifiers) and an output stage 9.

According to the illustrated preferred embodiment, transistors 1 and 3 are NPN bipolar transistors while transistor 7 is a PNP bipolar transistor. However, transistors 1, 3 and 7 can alternatively be FET transistors or other active circuit elements for performing the required signal amplification, as will be described in greater detail below.

Operating current flows through the mirror image amplifiers from a first source of DC power 10 through pull up resistor 12, and flows out of the mirror image amplifiers through further pull-up resistor 14 to a second DC power source. According to a successful prototype, power source 10 delivers +85 volts while source 16 delivers −85 volts of DC power to the mirror image amplifier pair.

The aforementioned cascode stages function as transconductance amplifiers for controlling the voltage gain of the entire video amplifier circuit. The output stages 5 and 9, on the other hand, function to isolate the load capacitance of the CRT from the respective cascode stages in order that a sufficiently wide bandwidth can be achieved.

A preamplifier 11 is provided for receiving and level adjusting an input video signal according to the output of a feedback clamping network 13. The function of the feedback clamping network 13 is to sample the video output signal applied to the control grid for effecting DC adjustment of the preamplified input signal output from preamplifier 11. The construction and operation of the preamplifier 11 and feedback clamping network 13 are not described in detail herein, but are believed to be well within the expected knowledge of a person skilled in the art to which the present invention pertains.

Operation of the invention will be described with reference to the first of the aforementioned mirror image amplifiers. As discussed above, the cascode stage comprises a common-emitter amplifier 3 connected in series with a common-base amplifier 1, each amplifier comprising a bipolar junction transistor. The transconductance (gm) of the common emitter amplifier 3 is $1/(R15+re)$, where re is the emitter-ballast resistance of the common emitter transistor 3 and 7 and R15 represents the value of the external resistor 15 connected to the emitter of transistor 3, in a well known manner.

A base terminal of transistor 1 is connected to a source of bias voltage 17 such that the transistor operates as a current buffer. Thus, the gain of the cascode stage is essentially the same as that of the common emitter transistor 3, and thus equals -gmR12, where R12 is the resistance of pull-up resistor 12.

The cascode configuration of transistors 1 and 3 eliminates the well known Miller capacitance multiplication effect and thus is capable of achieving on operating bandwidth of over 100 megahertz. The cascode configuration is also characterized by transition times which have been found to be less than 5 nanoseconds. The transition times can be further enhanced by including an RC peaking network shunted with the emitter resistor 15, and exhibiting a value of resistance close to R15 and an RC constant equal to a few nanoseconds. Furthermore, the addition of a peaking coil (not shown) to the collector terminal of common base transistor 1 can further improve the transition times.

The cascode stage for the mirror image amplifier comprises transistors 3 and 7 connected to DC power source 16 via pull-up resistor 14, as described above. Because this latter amplifier is a mirror image of the above-discussed amplifier, its operation is identical.

As discussed above, each of the mirror image amplifiers include respective output stage 5 and 9 in the form of emitter-followers which are biased at the Class B operating point. According to the preferred embodiment, a pair of diodes are used for providing typically no more that 0.6 volts of bias to the emitter-follower transistor configuration in order to maintain the above discussed Class B operating point. However, in the event that high frequency transitions are required at the output stage, more current is typically drawn so that the emitter follower transistors will have a tendency to heat up. The elevated junction temperature can result in a shift from Class B bias to Class AB bias, in a well known manner.

Additional details of construction and operation of emitter follower output stages 5 and 9 are not discussed in detail herein but would be well known to a person skilled in the art.

Considering the circuit as a whole, the two mirror image video amplifiers are cascaded together to form the complete video amplifier, with one side being powered by DC source 10 and the other side being powered by DC source 16. As discussed above, transistor 3 functions as a transconductance amplifier for converting the preamplified input voltage signal received from preamplifier 11 into an amplified current signal ($i_c$) and an emitter current ($i_e$) to the emitter terminals of transistors 1 and 7 respectively. Thus, in effect, transistor 3 functions as a voltage controlled current source. Since transistors 1 and 7 are configured as common-base amplifiers which merely act as current buffers, the same collector current and emitter current from transistor 3 appear at the collector terminals of transistors 1 and 7 respectively. In addition, since the collector current ($i_c$) is almost equal to the emitter current ($i_e$), essentially the same current flows through each mirror pair of amplifiers.

Consequently, the same signal current flows from DC voltage source 10 to opposite polarity voltage source 16 through pull-up resistors 12 and 14. This current thus produces a pair of voltage signals with equivalent amplitude across resistors 12 and 14, one voltage signal being of opposite phase to the other. These voltage signals are then applied by the emitter follower output stages 5 and 9 to the cathode and control grid, respectively, of the CRT electron gun.

In accordance with the successful prototype, the combined voltage output results in a total signal swing amplitude of as high as 140 volts. The magnitude of the voltage signal swing depends on the biasing voltages of the common base transistors 1 and 7. For example, according to the successful prototype, transistors 1 and 7 are biased at +6 volts and −1 volts via respective DC bias voltage sources 17 and 19. Accordingly, the maximum output swing voltage for the successful prototype can be expressed as $(85-6-Vcb1)+(85-1-Vbc7)$, where Vcb1 denotes the collector-base voltage of transistor 1 and Vcb7 denotes the collector-base voltage of transistor 7. The maximum signal current is thus $(85-6-Vcb1)/R12$ for linear operation.

Figure 2:
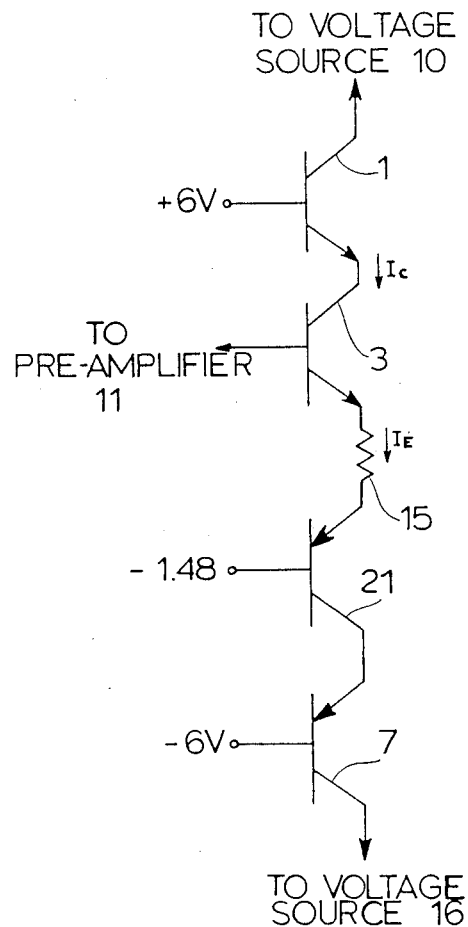
FIG. 2 is a schematic diagram of a cascode stage of the video amplifier circuit in accordance with an alternative embodiment.

Although FIG. 1 illustrates the circuit in accordance with a preferred embodiment of the present invention, other modifications and variations are possible. For example, according to the alternative embodiment of FIG. 2, an additional PNP transistor is shown connected between emitter resistor 15 and transistor 7, in order to obtain better symmetry between the output voltage signals.

All such modifications and variations are believed to be within the sphere and scope of the present invention as defined by the claims appended hereto.

I CLAIM

1. A circuit for generating equal amplitude and opposite phase signals, comprising a pair of cascaded amplifiers connected via respective equal valued resistances to a pair of opposite polarity power sources, and a voltage controlled current source common to each said pair of amplifiers for receiving an input signal and in response generating a common current signal within each said pair of amplifiers such that equal amplitude and opposite phase voltage signals are generated across said respective resistances.

2. The circuit of claim 1 wherein said pair of cascaded amplifiers comprise a pair of common-base amplifiers operating as current buffers for said common current, and said voltage controlled current source comprises a common-emitter amplifier intermediate said pair of common-base amplifiers.

3. The circuit of claim 1 further comprising a pair of emitter follower stages connected to respective ones of said cascaded amplifiers.

4. The circuit of claim 2 further including a peaking coil connected to respective collector terminals of said pair of common-base amplifiers for enhancing transition times of said common current signal.

5. The circuit of claim 2 further including a transistor intermediate said common-emitter amplifier and a predetermined one of said pair of common-base amplifiers for enhancing symmetry of said common current signal.

6. A video amplifier for controlling an electron source cathode and a control grid of a cathode ray tube, comprising:
   (a) a first cascode stage connected to a first DC power source through a first pull-up resistor;
   (b) a second cascode stage connected to a second DC power source through a second pull-up resistor;
   (c) a voltage controlled current source common to each said first and second stages for receiving an input signal and in response generating a common current signal within each said first and second stages such that respective first and second equal amplitude and opposite phase voltage signals are generated across said first and second pull-up resistors, respectively;
   (d) a first emitter-follower stage for receiving and applying said first voltage signal to said electron source cathode while isolating load capacitance of said cathode ray tube from said first cathode stage; and
   (e) a second emitter-follower stage for receiving and applying said second voltage signal to said control grid while isolating load capacitance of said cathode ray tube from said second cathode stage.

7. The video amplifier of claim 6 wherein said first cathode stage and said common current source respectively comprise a common-base amplifier and a common-emitter amplifier connected in series.

8. The video amplifier of claim 6 wherein said second cathode stage and said common current source respectively comprise a common-base amplifier and a common-emitter amplifier connected in series.

9. The video amplifier of claim 7 wherein said first emitter-follower stage is biased via diode means for operation in Class B mode, said diode means being connected to said first resistor and to a collector terminal of said common-base amplifier.

10. The video amplifier of claim 8 wherein said second emitter-follower stage is biased via diode means for operation in Class B mode, said diode means being connected to said second resistor and to a collector terminal of said common-base amplifier.

11. The video amplifier of claim 7, further comprising a source of bias voltage connected to a base terminal of said common-base amplifier.

12. The video amplifier of claim 7 wherein said common-base amplifier and said common-emitter amplifier are connected via respective emitter and collector terminals thereof.

13. The video amplifier of claim 8 wherein said common-base amplifier and said common-emitter amplifier are connected via respective collector and emitter terminals through a further resistor.

14. The video amplifier of claim 11 wherein said source of bias voltage is 6 volts DC.

15. The video amplifier of claim 11 wherein said source of bias voltage is −1 volt DC.

16. The video amplifier of claim 6, wherein said first and second DC power sources generate +85 volt and −85 volt DC signals respectively.

17. The video amplifier of claim 7 further comprising a preamplifier for preamplifying and applying said input signal to a base terminal of said common-emitter amplifier, and a feedback clamping network for sampling said second voltage signal applied to said control grid and in response adjusting DC level of said preamplified input signal, thereby compensating for voltage drift within said video amplifier.

18. The video amplifier of claim 7 further including a peaking coil connected to respective collector terminals of said common-base amplifier for enhancing transition times of said common current signal.

19. The circuit of claim 7 further including a transistor intermediate said common-emitter amplifier and said common-base amplifier for enhancing symmetry of said common current signal.

* * * * *